(12) United States Patent
Neisch et al.

(10) Patent No.: US 6,269,319 B1
(45) Date of Patent: Jul. 31, 2001

(54) RECONFIGURABLE INTEGRATION TEST STATION

(75) Inventors: Jonathan C. Neisch, Maryland Heights; Donald E. Turner, Creve Coeur, both of MO (US)

(73) Assignee: The McDonnell Douglas Corporation, St. Louis, MO (US)

(*) Notice: Subject to any disclaimer, the term of this patent is extended or adjusted under 35 U.S.C. 154(b) by 0 days.

(21) Appl. No.: 09/240,431

(22) Filed: Jan. 29, 1999

(51) Int. Cl.[7] .................... G01R 31/00; G06F 19/00
(52) U.S. Cl. .................... 702/118; 702/121; 702/123; 714/741; 714/742
(58) Field of Search .................... 702/118, 121, 702/122, 123; 714/741, 742; 324/73.1

(56) References Cited

U.S. PATENT DOCUMENTS

| | | | |
|---|---|---|---|
| 4,402,055 | * 8/1983 | Lloyd et al. | 702/121 |
| 4,760,329 | * 7/1988 | Andreano | 714/32 |
| 4,760,330 | * 7/1988 | Lias, Jr. | 714/32 |
| 5,036,479 | * 7/1991 | Prednis et al. | 702/121 |
| 5,223,788 | * 6/1993 | Andreano et al. | 324/73.1 |
| 5,414,639 | 5/1995 | Sugimoto et al. | 364/489 |
| 5,437,030 | 7/1995 | Reitman et al. | 395/630 |
| 5,614,896 | 3/1997 | Monk et al. | 340/945 |
| 5,638,383 | 6/1997 | Wotzak et al. | 371/22.5 |
| 5,793,218 | 8/1998 | Oster et al. | 324/754 |

* cited by examiner

Primary Examiner—Kamini Shah
Assistant Examiner—Bryan Bui
(74) Attorney, Agent, or Firm—Bryan Cave LLP

(57) ABSTRACT

An integration test station for aircraft is provided in which the system is operable with multiple aircraft configurations. The integration test station permits aircraft component designs to be tested and verified in a simulated environment representing integration of the component into the aircraft.

29 Claims, 4 Drawing Sheets

US 6,269,319 B1

RECONFIGURABLE INTEGRATION TEST STATION

FIELD OF THE INVENTION

This invention pertains to test systems, in general, and to an integration test system for aircraft, in particular.

BACKGROUND OF THE INVENTION

An aircraft is an assembly of numerous interacting mechanical and electrical components that need to function properly for the aircraft to operate safely. An important step in the manufacture of aircraft is the testing of each component in order to verify the design of the component. The operability of a newly designed component when integrated into the environment of an aircraft is essential to a determination of the viability of the design. Testing of this kind is referred to as "integration" testing. Almost all aircraft components are subjected to integration testing prior to installation in the aircraft. To perform such testing, it is important that the component is tested in an environment that simulates the conditions that will occur during flight. This testing requires that the component receives stimuli which are representative of the stimuli that would be received during actual flight conditions and that the component responds to the stimuli in a predictable and correct fashion.

One method of testing newly designed components is to rely either on flight testing of the aircraft or on system testing when the aircraft is on the ground. Flight testing, as the name implies, involves flying the aircraft in order to ensure that the various components operate properly with each other and that the design of a new component or the new design of an existing component operates as expected. Flight testing, while useful, has limitations. In flight testing it is difficult, if not impossible, to expose an aircraft to all conditions to which it might be exposed in order to observe how the component will respond. For example, environmental conditions such as sudden cross winds cannot be developed on command. Also, complex aircraft, such as modem commercial airliners, comprise a large number of components that are assembled into numerous systems. The complexity increases even more with modem military aircraft. The components and systems must be subjected to numerous test procedures in order to ensure that the design functions properly. It is neither an efficient use of time nor an efficient use of resources to repeatedly flight test an aircraft solely to ascertain whether a specific assembly of components are performing as anticipated. In addition, a number of test procedures involve verifying or determining the operation of the aircraft under potentially threatening or extreme conditions such as high wind, low altitude flight conditions. Testing an aircraft under such conditions can jeopardize the safety of both the aircraft and the flight crew.

The alternative to flight testing an aircraft is ground testing utilizing integration test stations. Integration test stations are distinct and separate from test stations that are utilized for testing during manufacture or subsequent to manufacture for maintenance. One key distinction is that integration test stations are used to verify design and operation of the component being tested in a simulated operational environment, whereas other test equipment is used for verification of operability on equipment or components after validation.

All prior integration testing systems are aircraft specific. In many instances the testing systems are even aircraft version specific. It is highly desirable that an integration test system be available to be operable with multiple aircraft and to be easily changeable from one aircraft to another.

SUMMARY OF THE INVENTION

In accordance with the principles of the invention an integration test station is provided that may be utilized for multiple aircraft and/or aircraft versions. An integration test station in accordance with the invention has the capability to perform acceptance testing and permits the user to "break into the system" to troubleshoot design anomalies as well as perform design performance tests. The integration test system supports an integration capability into which other real systems can be easily connected or simulated in an endless variety of possible combinations. This capability allows system developers to verify design operation and interaction between subsystem elements.

In a system in accordance with the invention, simulation and monitoring functions are modularized. Circuit cards and cables are reused from configuration to configuration. Control and monitoring aspects of simulation and monitoring functions are supported with a power and communications core. Signal paths from simulation cards are routed through jumper connectors/plugs that permit connectivity to real aircraft components.

Software is provided in a host computer that contains a core operating system that in turn calls down different simulation or monitor configurations to match the specific system under test. Configurations are user selectable during system power up.

Simulation and monitor modules are connectorized with connectors utilized to map to specific system wiring. The connectors can be easily changed to switch between different systems.

In accordance with the principles of the invention, an integration test station includes software that is reconfigured for each new configuration for which testing is to be performed. Further in accordance with the principles of the invention, an integration test station includes a cable arrangement that permits connection to a large number of different aircraft components and permits validation of component designs. The cable arrangement is connectorized to a "personality module" that maps wiring by different functions to various circuit boards.

BRIEF DESCRIPTION OF THE DRAWING

The invention will be better understood from a reading of the following detailed description in conjunction with the several figures of the drawing in which like reference numerals are used to designate like elements and, in which.

DETAILED DESCRIPTION

Integration test stations are distinct from acceptance test equipment that is utilized in a production environment. There are key points that are important to understanding the distinctions. Although an integration test station has the capability to perform all acceptance test functions in a production environment, it also permits the user to "break into the system" and troubleshoot design anomalies as well as to perform design performance tests. Additionally, an integration test station should allow for verification of design operation and interaction between subsystem elements.

Figure 1:
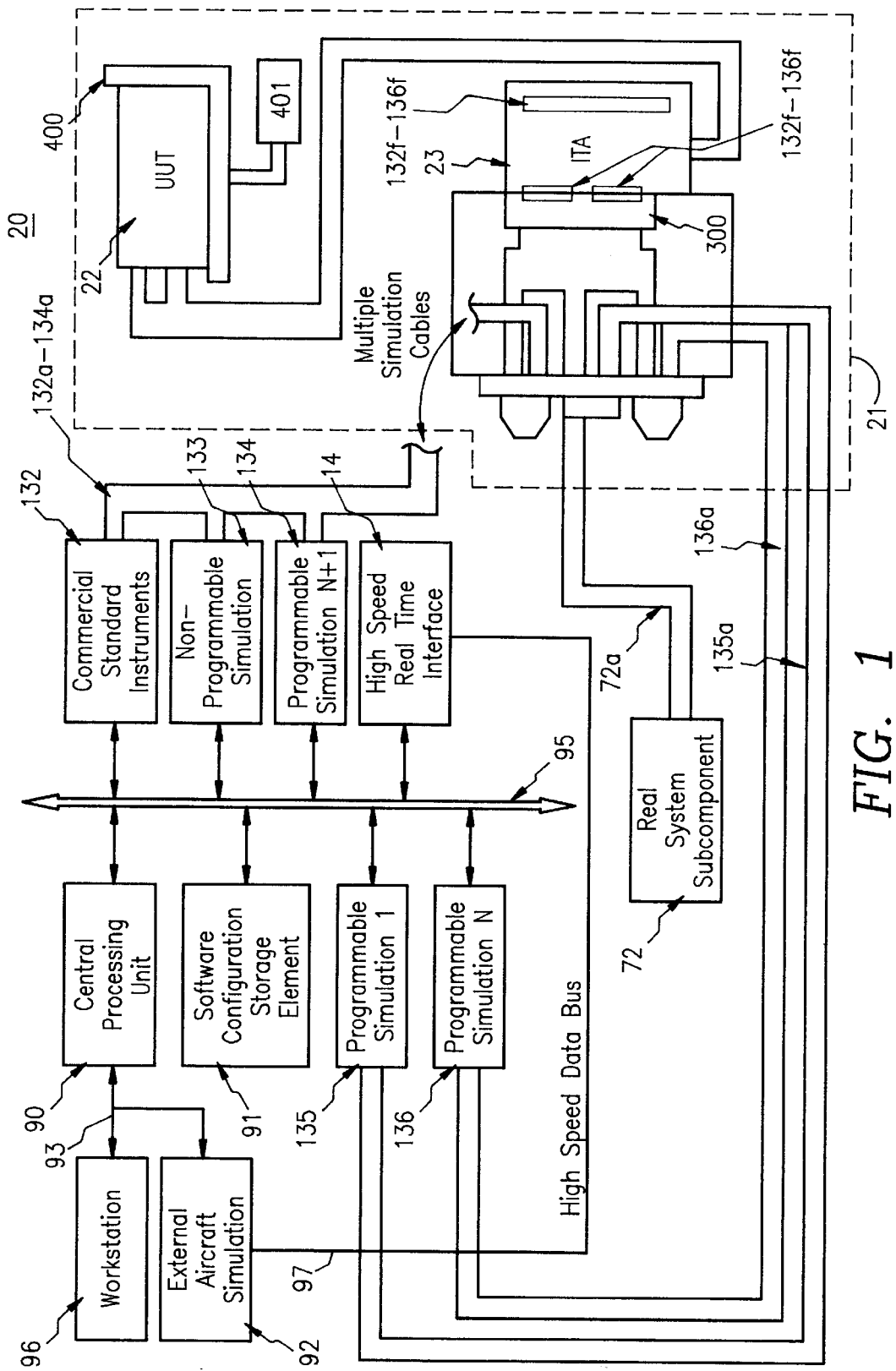
FIG. 1 illustrates in block diagram form an integration test station in accordance with the invention.
Figure 1A:
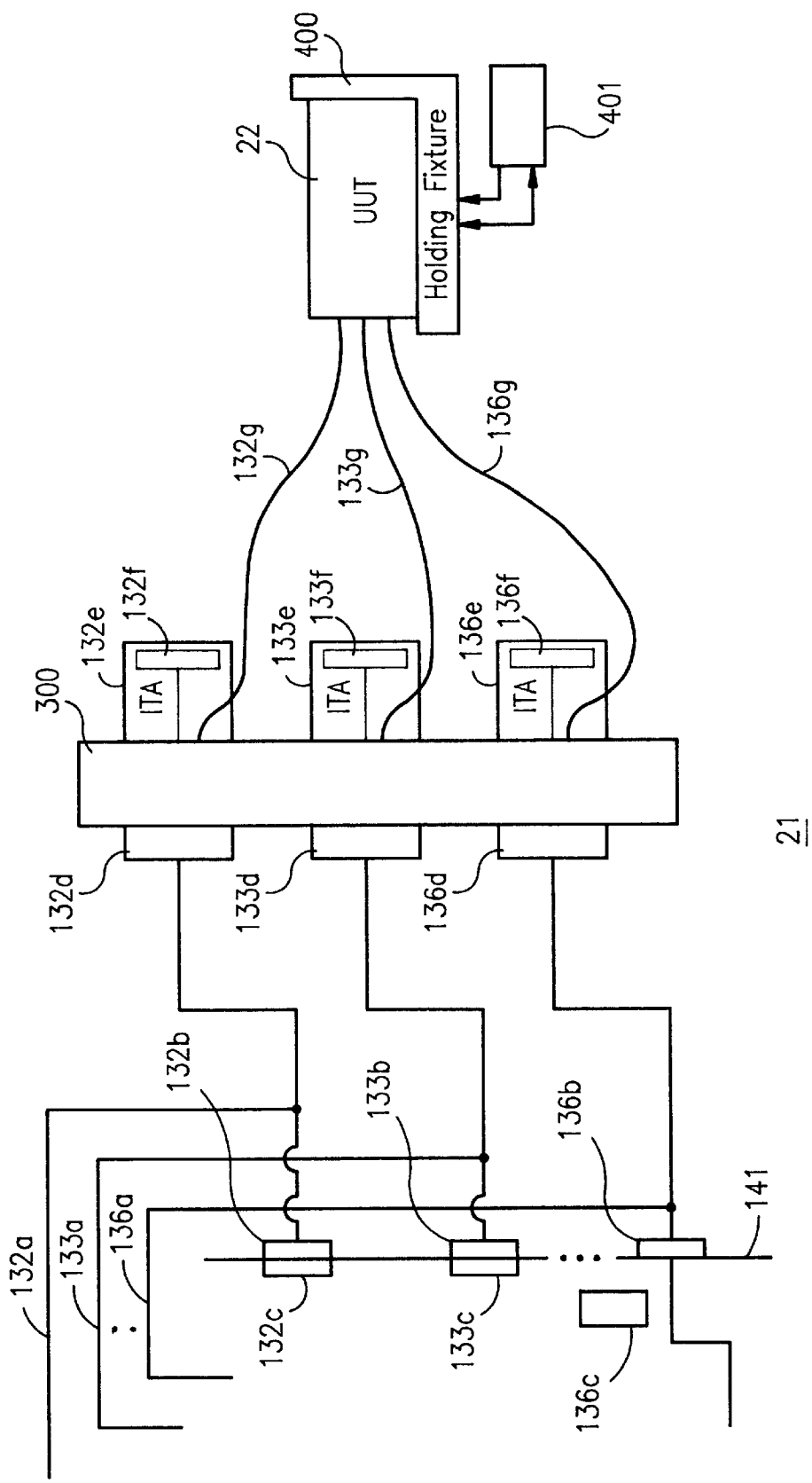
FIG. 1A illustrates a portion of the station of FIG. 1 in greater detail.
Figure 2:
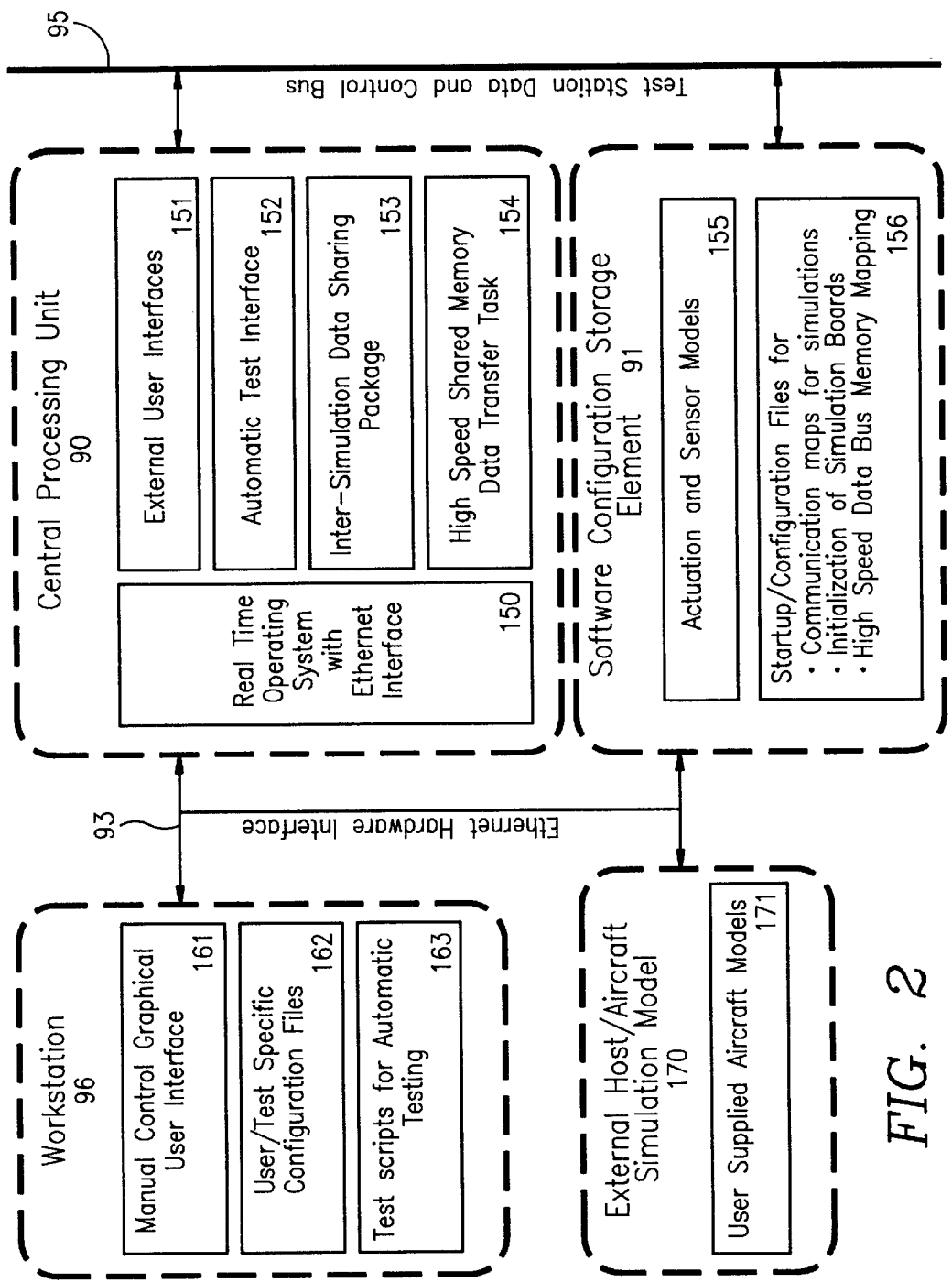
FIG. 2 depicts the software architecture of a test system formed in accordance with the invention.

FIG. 1 and FIG. 1A depict an aircraft integration test station 20 formed in accordance with the principles of the invention connected to an aircraft unit under test (UUT) 22. System 20 includes a central processing unit 90 which is coupled to a workstation 96. As shown in FIG. 2, central processing unit 90 is coupled to workstation 96 via an Ethernet hardware interface 93. Workstation 96 is a commercially available workstation of a type that conforms to a UDP/IP Ethernet Protocol. From the workstation 96, a user of system 20 can control and direct testing of UUT 22. System 20 includes commercially available standard instruments 132 as well as non-programmable simulation or simulator cards 133 and programmable simulation or simulator cards 134–136. The instruments 132 and the non-programmable and programmable simulator cards 133–136 generate stimuli normally received by the components of the particular aircraft in which the UUT 22 is designed for installation. Instruments 132 as well as the non-programmable and programmable simulator cards 133–136 are coupled to central processing unit 90 via a high speed backplane or bus 95. Some of commercial instruments 132 are used to monitor the response of the components of the aircraft and other ones of commercial instruments 132 generate stimuli. Central processing unit 90 contains a real time operating system that contains an Ethernet driver capable of parsing a test station standard message into commands for simulation control and monitoring. A memory or software configuration storage element 91 is coupled to central processing unit 90 via common high speed backplane or bus 95. The common high speed backplane or bus 95 is of a type known in the art and is referred to as a VME bus or backplane. As shown in FIG. 2, software configuration storage element 91 includes actuation and sensor models 155 and startup/configuration files 156.

Prior to power up of UUT 22, the system 20 user will connect an Interface Test Adapter (ITA) 23 selected for UUT 22. Installation of ITA 23 and UUT 22 comprise the hardware aspects of configuring integration test station 20 for a specific aircraft. Subsequently, the appropriate software is loaded using the software configuration storage element 91. When central processing unit 90 is operated to run integration tests on a specific component 22, the system user will enter information to the central processing unit 90 via workstation 96 which specifies what aircraft system is to be tested. In the embodiment of the invention shown, the system user specifies the system to be tested during power up. All configuration information and simulation models are stored in the software configuration storage element 91. Central processing unit 90 loads appropriate models and communication data as required for each specific system application from software configuration storage element 91. This is accomplished during power up by the system user specifying what system is to be tested. After power up, simulator cards 133–136 and commercial standard instruments 132 autonomously provide simulation conditions to UUT 22. Central processing unit 90 operates as a communications control and conduit that receives formatted messages and directs the appropriate commands to the simulator cards 133–136 and instruments 132. Central processing unit 90 also reads appropriate monitor signals from the instruments 132 as well as from those of simulator cards 133–136 which provide monitoring functions. In addition, a high speed real time interface 14 is coupled to high speed backplane or bus 95. High speed real time interface 14 is coupled via a high speed data bus such as an Ethernet bus 97 to external aircraft simulation models 92. Real time parameters can be read either via high speed real time interface 14 or via central processing unit 90 to support aircraft dynamics to the aircraft component 22. The real time parameters are used to control the operation of instruments 132 and simulator cards 133–136 and also include data relevant to expected response data obtained from the UUT 22. When the stimuli are applied to UUT 22, instruments 132 and certain ones of the simulator cards 133–136 monitor responses from component 22. Central processing unit 90 analyzes the output signals from UUT 22 and from simulated actuation of any cockpit controls. Instruments 132 and simulator cards 133–136 are instructed by central processing unit 90 to produce an updated set of stimuli. All simulation and monitoring functions are integrated onto common high speed backplane or bus 95 which can accommodate any combination of simulations or monitoring functions to suit the needs of the system test. Central processing unit 90 integrates all simulations together to provide the user of system 20 control of all types of simulation from one workstation using a similar graphical interface that is used across a multitude of simulations.

FIG. 2 illustrates in block form the software architecture utilized in the integration test station 20 (FIG. 1). Central processing unit 90 includes a real time operating system 150 that includes an Ethernet interface. The Ethernet interface conforms to a UDP/IP Ethernet protocol. Operating systems of this type are commercially available. Central processing unit 90 and the software executed at central processing unit 90 acts as a central point where all information is passed between internal simulations at integration test station 20 and the outside world. An external host/aircraft simulation model 170 connected to integration test station 20 can control simulations if the software on the external host/aircraft simulation model 170 is programmed to communicate with integration test station 20 using the integration test station 20 protocol. External host/aircraft simulation model 170 includes user supplied aircraft models 171. After start up and initialization of the simulations, central processing unit 90 executes tasks 151 through 154. Task 151 provides an external user interface whereby a user of the system can designate operational testing. Task 152 provides for automatic testing of UUT 22. Inter-simulation data sharing package 153 provides for the intercommunication of simulator data among the instruments 132 and simulation cards 133–136. High speed shared memory data transfer task 154 permits the communication between the various units connected to the high speed backplane or bus 95.

Workstation 96 operates in tandem with the external host/aircraft simulation model 170 allowing the system operator at a workstation 96 to inject failures into parts of the simulated aircraft while it is in flight to evaluate the responses of UUT 22 with the pilot in the loop to evaluate handling qualities in different failure situations. Injection of failures can be accomplished using a manual control graphical interface 161 which operates in conjunction with user/test specific configuration files 162. Automated testing capability provided by test scripts 163 permits integration test station 20 to test a system's performance before going to a simulation environment. This validation is to prove that the system matches the design criteria for the aircraft. Configuration files 162 are used to configure the work station for the particular test to be performed. Configuration files 162 contain the names and data signals specific to UUT 22 along with memory mapping to simulations so that the user of integration test station 20 only has to understand UUT 22 and not be concerned with how integration test station 20 operates. When a different UUT 22 is under test, appropriate configuration files are reloaded for that application and the user for that UUT 22 can use the names for that specific UUT 22. Integration test station 20 initializes all control variable names to accommodate the user and eliminates the need for extensive training on the use of the integration test station 20. When integration test station 20 is started up, the configuration files are used to assemble system tables and maps to the specified system being subjected to testing. Test scripts 163 are use to edit files by setting sequences and exercising the system as an open loop system. This permits external testing of the aircraft system and UUT 22 in a static environment to verify the design of UUT 22.

In prior systems used for integration testing of a component, the system 20 is uniquely configured for the particular aircraft which contains the component to be tested. In accordance with the present invention, the system 20 automatically configures itself for one of a plurality of aircraft.

Figure 3:
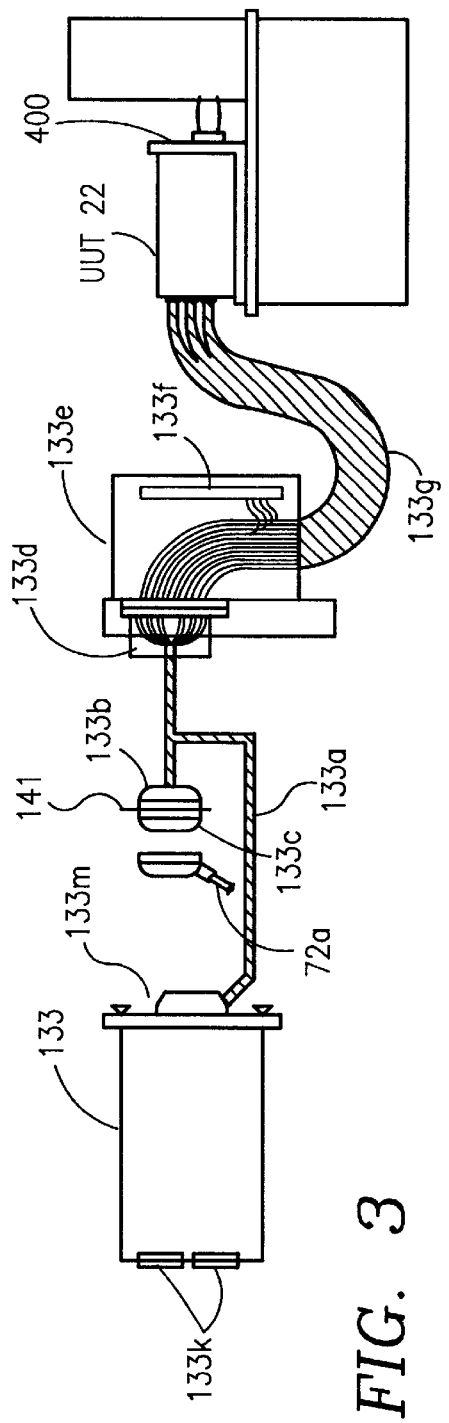
FIG. 3 illustrates a portion of the integration test station of FIG. 1 in greater detail.

In the test integration system of the present invention, simulation and monitoring functions are modularized. FIG. 3 illustrates the connections of a single simulator card to the UUT 22. By way of example, the simulator card shown in FIG. 3 is simulator card 133, but can be any of the simulator cards shown in FIG. 1. Simulator card 133 has 133k that allow simulator card 133 to be inserted into the high speed backplane or bus 95 identified in FIG. 1. Simulator card 133 has a connector 133m which mates to a connectorized cable 133a. Cable 133a splits into a "T" with one branch of the "T" running to a real aircraft interface panel 141. A connector on the real aircraft interface panel 141 has a connector 133b. A jumper connector 133c is connected to connector 133b. Jumper connector 133c is used to provide a jumpered connection between simulator card 133 and UUT 22. If it is desired to connect another component such as a sensor or real aircraft component (FIG. 1) 72 to UUT 22, jumper connector 133c is removed and real aircraft component 72 is connected in by using connectorized cable 72a. The other branch of the "T" of cable 133a goes to a connector 133d which connects to interface test adapter card 133e. Interface test adapter card 132e is used to map the pins of the connector 133d so that the aircraft specific wiring is correctly mapped to a standard cable layout. A cable 133g extends to UUT 22. UUT 22 is disposed in a holding fixture 400.

Figure 4:
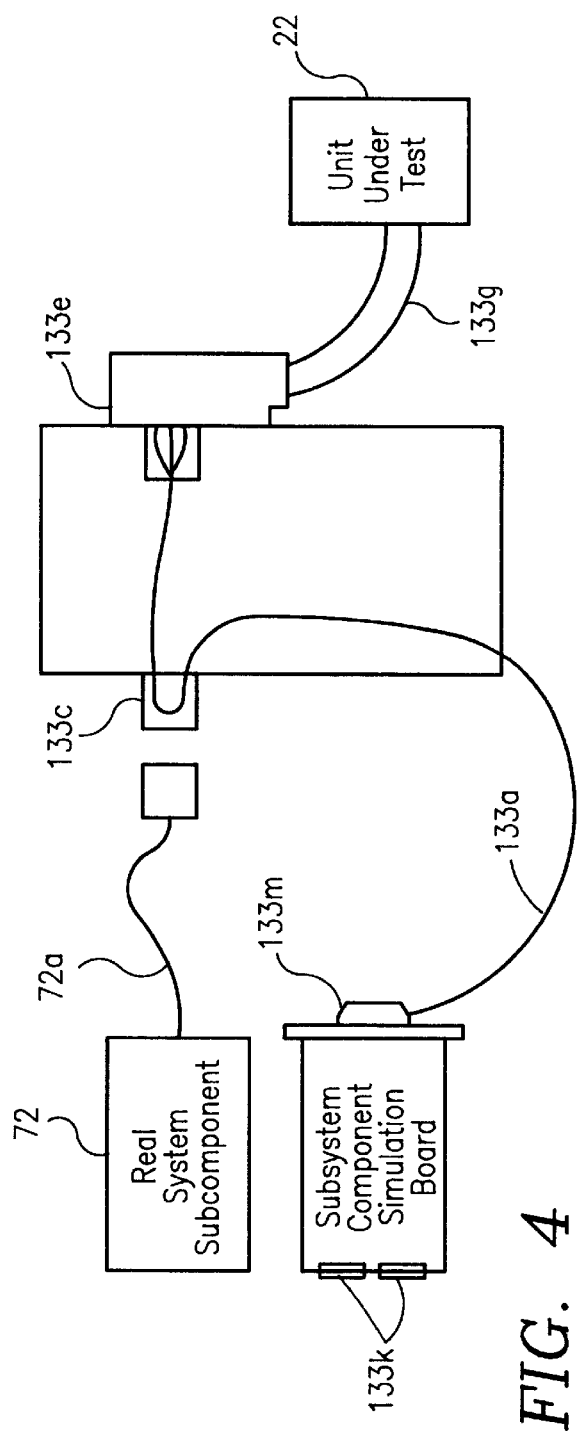
FIG. 4 is a connection diagram for the portion shown in FIG. 3.

FIG. 4 illustrates the connection path for the portion of the integration test station shown in FIG. 3. The connection path illustrates the connection between simulator card 133 via connector 133c to ITA 133e and to UUT 22.

Turning back to FIGS. 1 and 1A, the multiple connections of the commercial standard instruments 132 and simulator cards 133–136 is shown. Simulator cards 133–136 are coupled to central processing unit 90 via bus 95. The simulator cards 133–136 are reused from aircraft configuration to aircraft configuration and each represents a specific function that may be used from system to system.

Each simulator card 133–136 is associated with a particular function. Each simulator card 133–136 simulates one or two actuators or a sensor. Each simulator card 133–136 simulates analog or digital signals as appropriate. Each simulator card 133–136 and commercial standard instruments 132 has a cable connector. A connectorized cable 132a–136a is plugged into the respective connector. Each cable 132a–136a runs to a "T" with one branch of the "T" going to a real aircraft interface panel 141. The real aircraft interface panel 141 including connectors 132b–136b. Jumper connectors 132c–136c are useable to connect to connectors 132b–136b. Normally, signals are jumpered from the component 22 being tested to simulator cards 133–136 and instrument 132. If it is desired to hook up another component such as a sensor or real aircraft component 72a into any of the cables 132a–136a the corresponding jumper plug such as jumper plug 136c may be removed and a real aircraft component 72 is coupled in by a cable 72a. The other branch of the "T" of each cable 132a–136a goes to a connectorized interface test adapter of a type known in the art and made generally available by the Virginia Panel Corp. of Waynesboro, Va. This type of interface test adapter is known as a Virginia Panel Receiver. In the illustrative embodiment of the invention, the Virginia Panel Receiver 300 is of a type having fifty connectors arranged into two rows of connectors. Each connector 132d–136d has 96 pins. The connections to the Virginia Panel Receiver connector are arranged in accordance with a standard layout. Interface test adapter cards (ITA) 132e–136e connected to each connector 132d–136d are used as personality modules to map the pins of the respective connectors 132d–136d so that the aircraft specific wiring is correctly mapped to a standard layout. Each Interface Test Adapter card 132e–136e, includes a load card 132f–136f which simulates different loads corresponding to the aircraft specific elements that UUT 22 would be coupled to. Each Interface Test Adapter card 132e–136e, is removable and is wired for each specific aircraft. Cables 132g–136g extend to UUT 22 under test. UUT 22 sits on holding fixture 400. Holding fixture 400 is specific to UUT 22. Holding fixture 400 is specific to the particular aircraft and serves to connect UUT 22 under test to appropriate mechanical simulations 401 such as pneumatic sources, cooling sources, and other mechanical connections all of which may be coupled to central processing unit 90. The use of holding fixtures is known in the testing arts, and as those skilled in the art will understand, the holding fixture is program specific. Particular details of holding fixtures do not form part of the present invention.

With the arrangement of the present invention, multiple aircraft platforms are easily supported. Software may be reconfigured for each new system, autonomous hardware modules may be added or deleted as required to system interfaces, and the cabling is reconfigurable. Simulation signals from a core of simulations are provided in a standardized layout on a receiver panel. Aircraft specific wiring is accommodated by mapping in the Interface Test Adapter. Loads are contained in the ITA and therefore changing of the ITA changes the loads for the UUT. Thus program specific changes are accommodated by changing the ITAs, and by changing the cable between the ITA and the UUT and the holding fixture. Thus the integration test station of the present invention provides for easily reconfigurable cabling. With the integration test station of the present invention, if a new interface is developed, the test station can easily be utilized by providing new simulator cards. Each simulator card gets its own cable and connector. The cable is connected to the Virginia Panel Receiver 300 where an ITA provides mapping to the new simulation. If it is desired to upgrade the simulation and testing computers, an upgrade is easily accomplished by replacing only the circuit card.

Furthermore, as those skilled in the art will readily appreciate, although the invention has been described in terms of testing of units or components adapted for inclusion on aircraft, the integration test station may be used for other vehicular testing as well including land, sea, air and space craft whether manned or unmanned Although the invention has been described in terms of specific embodiments, those skilled in the art will appreciate that various changes, modifications and variations may be made to the embodiments without departing from the spirit or scope of the invention. It is intended that the invention not be limited by the embodiments shown but that the invention be limited in scope only by the claims appended hereto and that the claims encompass all such changes, modifications, and variations as well.

What is claimed is:

1. An integration test station for evaluating the design of a vehicle component, said test system comprising:
    a central processing unit for executing predetermined test sequences;
    a plurality of processor-controlled test instruments for generating different stimuli to which said vehicle component will be exposed to in operational use;
    a plurality of test instruments for measuring response of the component under test to stimuli applied to the component under test and to said other vehicle components;
    a memory coupled to said central processing unit, said memory containing a plurality of models, each of said models corresponding to one of a plurality of vehicles;
    said central processing unit obtaining one model of said plurality of models, said one model being specific to a predetermined vehicle for which a component to be tested is designed to be utilized on.

2. An integration test station in accordance with claim 1, comprising:
    a simulator card coupled to said central processing unit;
    a cable having a plurality of conductors;
    a first connector coupleable to said simulator card, and said cable being coupleable to said component.

3. An integration test station in accordance with claim 2, wherein:
    said cable comprises a first portion terminating in said first connector, and a second portion terminating in a second connector, said second connector being connectable to said component.

4. An integration test station in accordance with claim 3, wherein:
    said cable comprises a third portion terminating in a third connector, said third connector being connectable to a jumper plug.

5. An integration test station in accordance with claim 4, comprising:
    a jumper plug connectable to said third connector, said jumper plug providing selective interconnections between said plurality of conductors in said cable when said jumper plug is plugged into said third connector.

6. An integration test station in accordance with claim 3, comprising:
    an interface test adapter coupled between said second connector and said component.

7. An integration test station in accordance with claim 6, wherein:
    said interface test adapter comprises a plurality of loads connected to predetermined ones of said plurality of conductors.

8. An integration test station in accordance with claim 7, comprising:
    a holding fixture for receiving said component.

9. An integration test station in accordance with claim 1, wherein:
    said vehicle comprises an aircraft.

10. An integration test station in accordance with claim 9, comprising:
    a simulator card coupled to said central processing unit;
    a cable having a plurality of conductors;
    a first connector coupleable to said simulator card, and said cable being coupleable to said component.

11. An integration test station in accordance with claim 10, wherein:
    said cable comprises a first portion terminating in said first connector, and a second portion terminating in a second connector, said second connector being connectable to said component.

12. An integration test station in accordance with claim 11, wherein:
    said cable comprises a third portion terminating in a third connector, said third connector being connectable to a jumper plug.

13. An integration test station in accordance with claim 12, comprising:
    a jumper plug connectable to said third connector, said jumper plug providing selective interconnections between said plurality of conductors in said cable when said jumper plug is plugged into said third connector.

14. An integration test station in accordance with claim 13, comprising:
    an interface test adapter coupled between said second connector and said component.

15. An integration test station in accordance with claim 14, wherein:
    said interface test adapter comprises a plurality of loads connected to predetermined ones of said plurality of conductors.

16. An integration test station in accordance with claim 15, comprising:
    a holding fixture for receiving said component.

17. An integration test station for evaluating a design of a vehicle component, the test system comprising:
    a central processing unit;
    a first test instrument coupled to the central processing unit; and
    a memory coupled to said central processing unit and comprising models, the models corresponding to vehicles,
    wherein:
        the central processing unit loads a first one of the models from the memory;
        the first one of the models is specific to a predetermined vehicle; and
        the predetermined vehicle is a vehicle in which the vehicle component is designed to be utilized.

18. An integration test station in accordance with claim 17, wherein:
    the vehicle comprises an aircraft.

19. An integration test station in accordance with claim 17, comprising:
    a second test instrument coupled to the central processing unit.

20. An integration test station in accordance with claim 19, wherein:

the first test instrument generates a stimuli to which the vehicle component will be exposed in operational use; and the second test instrument measures a response of the vehicle component to the stimuli.

21. An integration test station in accordance with claim 20, wherein:

the central processing unit executes predetermined test sequences and controls the first and second test instruments.

22. An integration test station in accordance with claim 21, wherein:

the vehicle comprises an aircraft.

23. An integration test station in accordance with claim 17, comprising:

a simulator card coupled to the central processing unit.

24. An integration test station in accordance with claim 23, comprising:

a first connector coupled to the simulator card;

a second connector coupled to the vehicle component;

a third connector; and a cable comprising conductors having a first portion terminating in the first connector, a second portion terminating in the second connector, and a third portion terminating in the third connector.

25. An integration test station in accordance with claim 24, comprising:

a jumper plug coupled to the third connector, wherein:

the jumper plug provides selective interconnects between the conductors in the cable when the jumper plug is plugged into the third connector.

26. An integration test station in accordance with claim 25, wherein:

the vehicle comprises an aircraft.

27. An integration test station in accordance with claim 24, comprising:

an interface test adapter coupled between the second connector and the vehicle component.

28. An integration test station in accordance with claim 27, wherein:

the interface test adapter comprises loads connected to predetermined ones of the conductors.

29. An integration test station in accordance with claim 28, wherein:

the vehicle comprises an aircraft.

* * * * *